United States Patent [19]

Brinkhaus

[11] Patent Number: 5,303,414
[45] Date of Patent: Apr. 12, 1994

[54] METHOD AND DEVICE FOR MINIMIZING INTERFERENCE, IN PARTICULAR IN CONNECTION WITH FM RECEPTION

[76] Inventor: Stefan Brinkhaus, Hans.Thoma Str. 13, D 7537 Remchingen, Fed. Rep. of Germany

[21] Appl. No.: 757,772

[22] Filed: Sep. 11, 1991

[30] Foreign Application Priority Data

Sep. 11, 1990 [DE] Fed. Rep. of Germany ....... 4028768

[51] Int. Cl.$^5$ .............................................. H04B 1/10
[52] U.S. Cl. .................................. 455/296; 455/223; 455/303
[58] Field of Search ............... 455/296, 303, 205, 222, 455/223, 312, 308, 309; 375/104, 99

[56] References Cited

U.S. PATENT DOCUMENTS

| 3,843,928 | 10/1974 | Nishimura et al. | 455/212 |
| 3,983,488 | 9/1976 | Bush et al. | 455/208 |
| 4,517,518 | 5/1985 | Ishigaki | 455/223 |

FOREIGN PATENT DOCUMENTS

| 0099760 | 2/1984 | European Pat. Off. |
| 2142172 | 3/1972 | Fed. Rep. of Germany |
| 148427 | 5/1981 | Fed. Rep. of Germany |
| 34465289 | 7/1986 | Fed. Rep. of Germany |
| 3916789 | 2/1990 | Fed. Rep. of Germany |

OTHER PUBLICATIONS

Patent Abstracts of Japan showing Abstract 59168725.

*Primary Examiner*—Reinhard J. Eisenzopf
*Assistant Examiner*—Philip J. Sobutka
*Attorney, Agent, or Firm*—Spensley Horn Jubas & Lubitz

[57] ABSTRACT

A method and circuit for suppressing periodic noise interference in a broadcast signal received by a receiver, in which, during reception of the broadcast signal a dip occurs in the amplitude of the received broadcast signal each time noise interference is present, each dip having a slope, by the steps of: determining the values of the amplitude of the received signal; setting a basic received signal threshold value which is less than the value of the received signal at a time when no noise interference is present; during each occurrence of noise interference, increasing the threshold value by an amount proportional to the slope of the corresponding dip in the amplitude of the received signal; and acting on the received signal to suppress noise interference during a time when the amplitude of the received signal is below the increased threshold value produced by the increasing step.

10 Claims, 7 Drawing Sheets

METHOD AND DEVICE FOR MINIMIZING INTERFERENCE, IN PARTICULAR IN CONNECTION WITH FM RECEPTION

FIELD OF THE INVENTION

The invention relates to a method for minimizing interference, in particular in connection with FM (or PM) reception, caused by the interference of noise with the useful signal, where interference-specific information is derived from the total signal received, with the aid of which an output signal is corrected at least during the time periods of maximum interference (correction phase), and where the length of an amplitude dip below a preset threshold value of the total signal, caused by interference signals, in the range of the maximum interference phase cycle is used as the interference-specific information for controlling the length of the correction phase. The invention further relates to a circuit arrangement for implementing the method.

BACKGROUND OF THE INVENTION

Reception difficulties occurring in an FM receiver, in particular a non-stationary receiver such as a car radio, are caused by a multitude of interference signals, for example co-channel or adjacent channel reception and noise, as well as multi-path and foreign interference, the latter caused, for example, by computers or industrial installations. As long as the amplitudes of the interference frequency or frequencies remain below a certain threshold, they are additionally suppressed by means of the usual technology (limiting amplifier and limiting demodulator). However, when they reach amplitudes comparable to the amplitudes of the useful signal, strong amplitude fluctuations, caused by signal heterodyning (known as beat) and simultaneously extreme phase modulation occur. This is in principle also applicable for PM (phase modulation) receivers. However, it will be described here by reference, by way of example, to an FM receiver.

Thus, there have been various attempts to detect the presence of an interference component in the total signal received by appropriate circuit technology or suitable methods and, since it is impossible to eliminate the interference signal because of the non-linear characteristics in the circuit, to correct the outgoing signal, at least during the time periods of maximum interference, and in this way to eliminate at least approximately the interference signal during these critical time periods as much as possible, at least to the extent that the auditory impression is noticeably improved.

An "interference suppression system" of this type, and its base in the state of the art, are described, for example, in German Published, Non-Examined Patent Application DE-OS 39 16 789. In this interference suppression system, an interference component is filtered out of an FM demodulating signal with the aid of an interference suppression device and, after further processing, a level control signal is generated with the aid of a control signal generator which causes interruption of the transmission of the FM demodulation signal or the FM detector signal to the subsequent stage. In this connection, the threshold or the preset level at which this control signal generator reacts can be automatically pre-determined by means of the received interference level which is contained in the FM demodulating signal. When the control signal generator is operated with the aid of a level maintenance circuit, a multiplex signal is therefore maintained at the actual value prior to the level control signal of the control signal generator during a certain length of time (correction phase), because of which a step-like characteristic is generated in the course of the multiplex signal due to the blanking of the interference. The known device recognizes the presence of interference with the FM demodulating signal with the aid of a high-pass filter, i.e. in the frequency spectrum which occurs. It is possible by means of this to exactly define the presence, but not the start and duration, of a phase interference event. Therefore, interference blanking of this type usually employs fixed blanking times which, as a rule, also because of characteristics of circuit technology, for example of the high-pass filter, last considerably longer than a large portion of the interference signals, such as are generated, for example, by ignition interference.

For this reason German Published, Non-Examined Patent Application DE-OS 39 16 789 does not address the length of the level control signal of the control signal generator, but only provides a "certain period of time" during which the level control signal is maintained.

The rigid fixing or the presetting of the blanking time (i.e. the correction phase) made necessary by the circuit technology necessarily involves a compromise with respect to the normally or preponderantly occurring interferences and their length. If the correction phase is too long, a portion of the usable signal is "given away", if it is too short, the interference blanking is partial, and a portion of the interference appears in the signal on the output side without having been affected. The detection of interference on the frequency side, i.e. before demodulation, by means of the high-pass filter necessarily depends largely on the frequency spectrum of the listener. Here, too, it requires adherence to compromises regarding the value or the frequency spectrum of the interference signals in question.

This leads in the end to a blanking of some interference events, while others are not blanked and still others result in unnecessarily prolonged correction phases. In turn, this can lead to interference repetition frequencies (unblanked and partially blanked interference signals), the frequency values of which are located in a lower frequency range than the original interference repetition frequency and therefore are very unpleasant for the listener. Thus the solution proposed in German Published, Non-Examined Patent Application DE-OS 39 16 789 is limited in its reaction to the multiplicity of very different interference signals to only the adaptation of the interference signal level. An "individual" addressing of the actually occurring interference signal in respect to the beginning and ending of the blanking or the correction phase is not possible. It thus leads only to a partially satisfying operation when this method or the circuit characteristics proposed there are used.

Differing from the method described above, it is also basically known in connection with the identification of interference signals within a received total signal to evaluate the amplitude range which occurs simultaneously with an interference phase modulation (interference phase characteristic is the first derivative $d\phi/dt$ of the interference phase, which in the end appears as interference at the output of an FM demodulator). For example, German Published, Examined Patent Application DE-AS 21 42 172 discloses a blocking circuit in which the previously discussed problems of interference are resolved in that the low-frequency channel of the receiver is blocked by means of a "dead zone detector circuit" for the duration of amplitude dips if the incoming signal falls below a preset dip level, i.e. a preset threshold value. All that is disclosed therein regarding the value of this threshold is that it should take hold at a time when the signal field strength falls so far that "the usable signal sinks below the noise level". The size of the threshold value in this case can be set from the outside by affecting a related control signal, but then remains constant.

This known, species-defining method has the disadvantage that here, too, the selection of the threshold value of the dip level can only be based on an unsatisfactory compromise. Based on the nature of the occurring interferences, extremely rapid phase shifts and thus clearly audible distortions will be produced particularly by those interference signals which only lead to extremely amplitude dips in the total signal that are extremely small and while the amplitude of a received signal threshold value, remain above the set threshold value and consequently do not result in a correction, such as the blocking of the low frequency channel. They are in particular amplitude dips which are "small" in value but very steep and which can pass unharmed through the above mentioned "dead zone detector circuit" and therefore strongly impair the effectiveness of this blocking circuit.

In connection with a further method, disclosed in German Published, Non-Examined Patent Application DE-OS 34 46 529, the interfered received signal is also blocked out for the duration of the recognized interference. For this purpose the interference signal is generated from the received signal and is compared with a threshold value. Thus the beginning and end of an interference event are defined by the threshold value being exceeded in either direction. In this case an automatic adaptation of this threshold value to the frequency of interference in the received signal is provided in the sense that with increasing frequency of the interference, the threshold value is increased and in this way the circuit becomes increasingly less sensitive to the interference in order to assure at least adequate, even though qualitatively unsatisfactory, reception.

The last mentioned method in particular makes it clear that in connection with the problem of interferences and the distortions caused by them because of phase changes, it is at best possible to achieve a statistical improvement of the quality of the output signal by only introducing a constant or automatically adapting a threshold value for defining the correction phase.

In respect to individual interference, the correction phase defined in each of the known methods has been found to be insufficient, because its duration is only inadequately adapted to the duration of the individual interference event and therefore improvements of the quality of the output signal are only achievable with considerable restrictions.

SUMMARY OF THE INVENTION

It is therefore an object of the invention to improve the method in accordance with the mentioned species in such a way that interference signals of the most varied types and compositions can be dependably eliminated from the received total signal.

The above and other objects are attained, in accordance with the invention, in that the amount, or magnitude, of the threshold value, where the correction takes place, is fixed by the slope of the respective amplitude dip in the field strength in such a way that the threshold value is automatically increased with increasing slope of the amplitude dip and in this way the correction phase is initiated earlier, where the setting of the respective threshold value is also determined by the value of the total signal preceding the amplitude dip (reference level).

The basic finding underlying the method in accordance with the invention consists in that from the shape, in particular the edge slope and the depth, of the amplitude dips in relation to the reference level on the signal path of the total signal, the individual determination of the threshold value, and thus of its duration, in particular in respect to the beginning and end of the correction phase, is possible by means of the circuit components of the FM receiver. It is possible to use the field strength signal of the IF component, for example, as a signal in this case, but it is also possible to use, for example, the envelope curve of the IF signal itself for evaluation.

Starting with the blanking criteria in accordance with the invention, there is a possibility in connection with FM receivers, for example, to either blank out the portion with the maximum interference phase characteristics in the demodulated signal when customary limiter systems are used, or to prevent ab initio the demodulation of the signal in the range of an extreme interference phase characteristic by the use of a largely linear amplifier. Both possibilities have specific advantages and disadvantages. These two exemplary embodiments for realizing the method of the invention will be described with reference to block diagrams.

DESCRIPTION OF THE PREFERRED EMBODIMENTS

Figure 1:
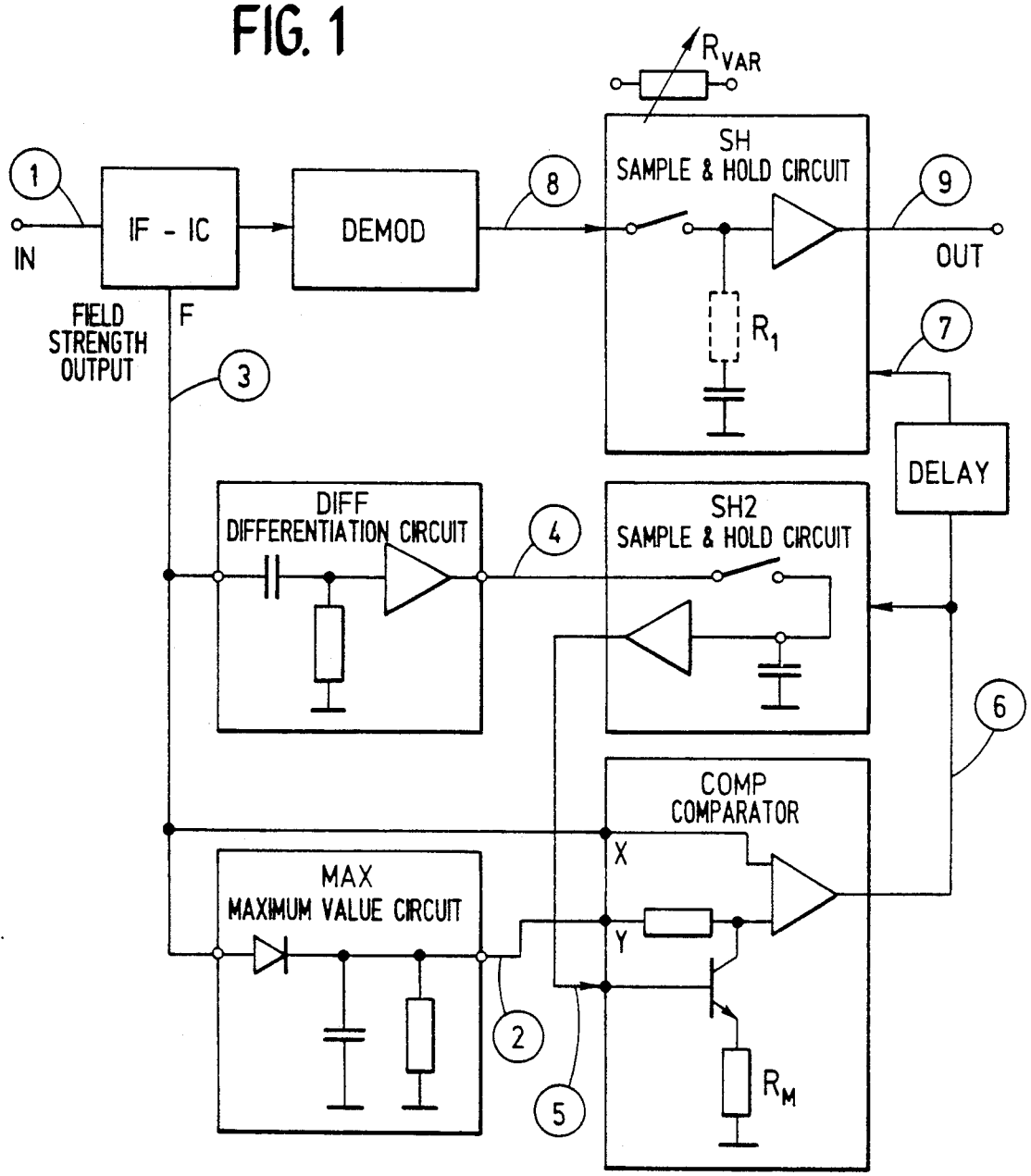
FIG. 1 is a block diagram of first exemplary embodiment of a circuit for executing the method according to the present invention.

The circuit depicted in the block diagram of FIG. 1 comprises an intermediate frequency circuit IF-IC with a signal input IN and a field strength output F, a demodulating circuit DEMOD downstream and a sample and hold circuit SH.

Components which generate a control signal for sample and hold circuit SH are connected the field strength output F and control input R of sample and hold circuit SH. One of these components is a maximum value circuit MAX which stores peak values of the signal F, present at the field strength output of circuit IF-IC, with a time constant $\tau$ defined by the RC value of a resistor and capacitor forming part of circuit MAX, to provide an actual maximum value signal $M^{(t)}$. This maximum value signal $M^{(t)}$ constitutes the reference level and is applied to an input y of a comparator COMP. The actual field strength signal F is applied to the other input x.

The comparator COMP is wired in such a way that it emits an output signal as a control signal for the correction phase when the actual field strength value present at the input x drops below the maximum value M present at the input y by an amount greater than a presettable threshold value $\Delta M$. Accordingly, the comparator COMP determines when in the course of an amplitude dip the depth of the amplitude dip has reached the value $\Delta M$.

The value $\Delta M$ can be adjusted by selection of the value of a resistor $R_M$ and in this way controls the current impressed on the comparator input y.

In accordance with the invention, the threshold value $\Delta M$ is now individually defined or automatically reset as a function of the respective amplitude dip. The slope of the amplitude dip is a measure of the amplitude of the interference phase. When an amplitude dip appears, it is therefore possible to determine very effectively an effective time for the beginning and end of the interference signal blanking based on differentiation of the field strength signal. A differentiation circuit DIFF is provided for this and acts on comparator COMP via a second sample and hold circuit SH2. Differentiation circuit DIFF generates an output signal which is proportional to the positive or negative rate of change, or slope, of the amplitude dip. The instantaneous value of this signal when the switching threshold is reached is maintained by the sample and hold circuit SH2. The output of sample and hold circuit SH2 is connected with the wiring of the input y of the comparator COMP so that, with an increasing slope of the amplitude dip, this signal therefore reduces the value $\Delta M$ by an amount $M_i$ proportional to the slope of the amplitude dip. The subscript "i" is intended to designate the consecutive numbers of the amplitude dip (interference) $S_i$, to indicate that each amplitude dip is considered individually. Briefly stated, the effect of this circuit therefore consists in that each amplitude dip forms its own switching threshold $E_i$ by itself and in this way individually defines its own correction phase in respect to its beginning and end.

Now, if the instantaneous value of the field strength signal at the input x of comparator COMP falls below the maximum value $M^{(t)}$ by a threshold value $E_i = \Delta M - M_i$ formed in this way, comparator COMP yields a control signal which reaches, via a delay circuit DELAY, the control input ST of sample and hold circuit SH and activates it until the threshold value $E_i$ is again passed and comparator COMP switches back on again. The signal coming from comparator COMP also maintains the sample and hold circuit SH2 for this period of time: once the threshold $E_i$ is again passed, SH2 is closed, or turned on, again and in this way the threshold value $E_i$ in comparator COMP is again reset to its base value $\Delta M$ while awaiting the next amplitude dip.

The threshold value of comparator COMP for determining the moment of blanking requires an appropriate reference level (maximum value) of the signal at the field strength output, F, because the ratio of maximum value M to switching threshold $(M - \Delta M + M_i)$ is decisive for the functioning of the circuit. This can be easily achieved if the logarithmic field strength output F present in most IF-ICs is used. Each voltage dip here generates, independently of the absolute value of the level, a "dB-proportional" voltage drop. If the latter voltage is applied to comparator COMP, the "correct" threshold value is automatically received without any additional efforts.

Figure 2:
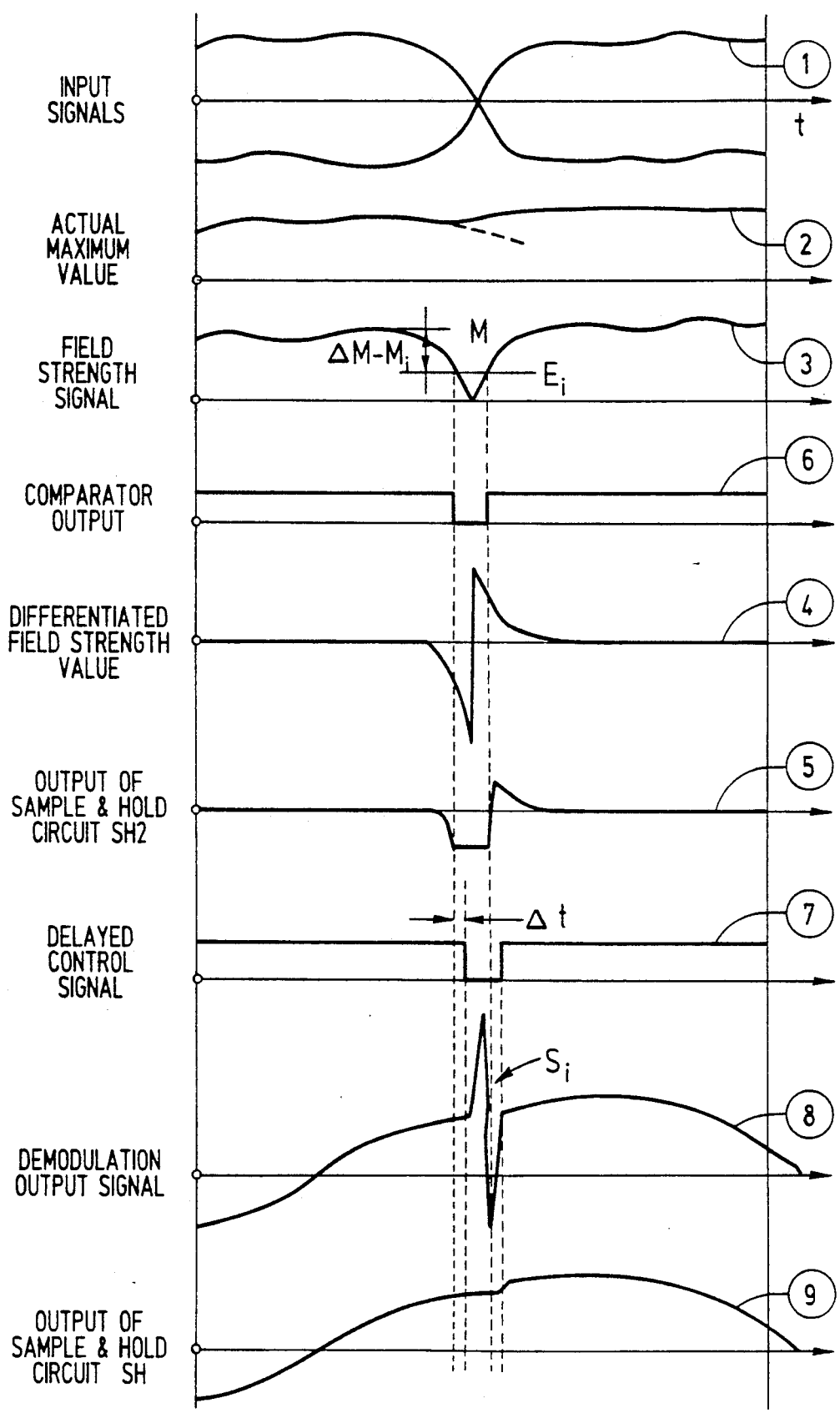
FIG. 2 is a series of diagrams illustrating the signal shapes occurring in individual sections of the circuit of FIG. 1.

The above described functions of the circuit are further clarified by the waveform diagrams of FIG. 2. The waveforms of FIG. 2 are identified by circled numbers and each waveform represents the signal appearing at a point in the circuit of FIG. 1 bearing a corresponding circled number. The input signal 1 of the IF amplifier has, because of an interference event, an amplitude dip illustrated in the center; the output signal present at the field strength output F qualitatively corresponds to one "half" of this signal. At the output of maximum value circuit MAX, the signal 2, a gently sloping ($\tau$) peak value signal, is applied to the input y of the comparator COMP, while signal 3 with an amplitude dip corresponding to that of signal 1 appears in the parallel branch connected to COMP input x.

In differentiation circuit DIFF the signal 4 (edge slope) is obtained from amplitude dip in signal 3, to form the control signal 5 which accesses the comparator COMP and there fixes the threshold value $E_i = \Delta M - M_i$. Accordingly, the output signal 6 of comparator COMP is a rectangular pulse, which passes through the delay circuit DELAY, resulting in the signal 7 of the same shape, but delayed by the time period $\Delta t$. Signal 7 activates the sample and hold circuit SH and exactly blanks out the interference peaks $S_i$ from the demodulator output signal 8 by keeping the output signal of demodulator DEMOD at its last value during the correction phase until the sample and hold circuit SH is deactivated once more.

The time period $\Delta t$ is the time delay, caused by the FM demodulator circuit, by which the interference peaks typically appear delayed in relation to the field strength dip at the output of the FM demodulator (approximately 1 $\mu s$ in case of an FM radio receiver).

The essentials of this circuit thus consist in that the duration of the correction phase is individually adapted to the correspondingly appearing interference signal and detection takes place prior to the appearance of the interference, so that, in contrast to the interference blanking of the known type, no delay of the MPX signal is necessary.

The structure of the sample and hold circuit SH shown by solid lines in FIG. 1 corresponds to a customarily employed base circuit: When the switch in circuit SH is opened, the momentary value of the signal present is represented by a charge of the capacitor $C_1$ and the signal voltage at the moment of opening remains at the output. The progressions of the curves shown in FIG. 2 illustrate an idealized state with a defined signal and a clearly recognizable interference event. In actuality, the signal progressions are very much more complex and are interfered with by additional HF signals, for example RDS signals. This means that in the moment when the correction phase is initiated, the amplitude of the signal to be corrected does not have its "correct" value in that, for example, the peak of such a "rapid" additional signal is superimposed. This has the result that this amplitude value is held by the sample and hold circuit SH over the duration of the correction phase. An improvement of this situation can be achieved in that such rapid signal changes are eliminated and instead a mean amplitude value is made constantly available, which forms a signal even in the correction phase. BY way of example: in the TV video signal the brightness signal constitutes the "slow basic modulation", the color signal the "rapid, superimposed" modulation.

The taking of this mean is achieved in the simplest way by means of the additional resistor $R_1$ indicated by dashed lines, by means of which "slow" amplitude changes continue to charge the capacitor $C_1$, while "rapid" amplitude changes only contribute to the mean value, the critical frequency being determined by $R_1$ and $C_1$.

In connection with some applications, for example car radio reception, it is desirable to use a variable resistor $R_{var}$, in place of the switch S in order to obtain "soft" holding. In actuality, such resistors $R_{var}$ may be constructed by means of FETs or OTAs.

Another problem with simple sample and hold arrangements lies in the generation of interference noise, such as switching spikes or offset problems, which can seriously endanger the actual purpose of removal of interference noise in the correction phase. For example, with weak signal levels they possibly generate larger interference pulses than those which they eliminate.

In principle this problem can be solved in that in place of a switching operation at the beginning and end of the correction phase a superimposition process is used, in which the signal which is to be interrupted (where the interference is expected) is continuously replaced by the previous mean signal value (as explained above).

Figure 1A:
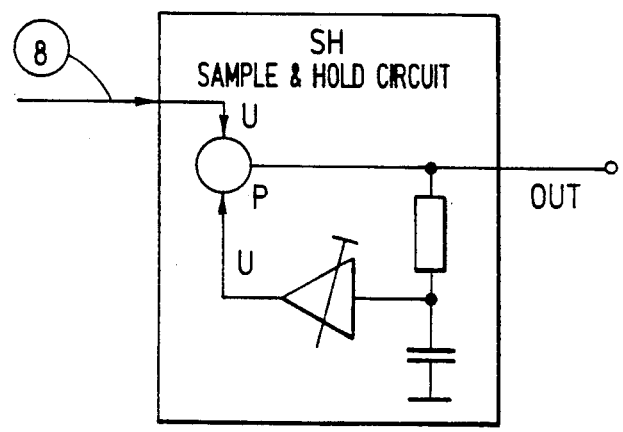
FIGS. 1A and 1B show embodiments of the circuit part SH in FIG. 1.

Such a circuit example is shown in FIG. 1A where the unchanged signal u, also identified in FIGS. 1 and 2 as signal 8, and the formed mean value $\bar{u}$ are present at inputs to a mixer P; in response to the control signal S from comparator COMP, the total signal u is replaced by the mean value $\bar{u}$ for a defined period of time. Cost-effective solutions can be realized in this manner which can avoid the above described disadvantages.

Figure 1B:
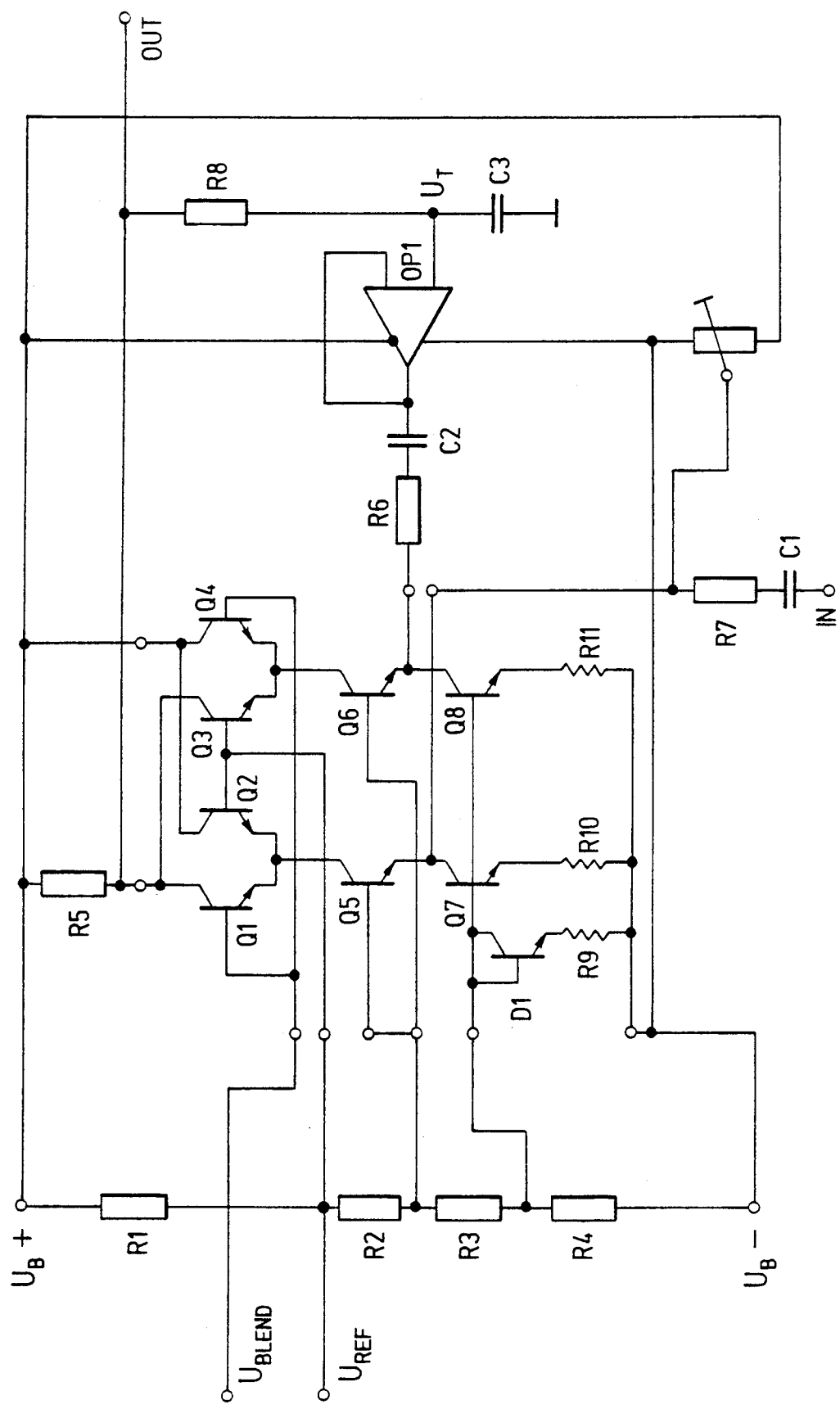
Figure 1C:
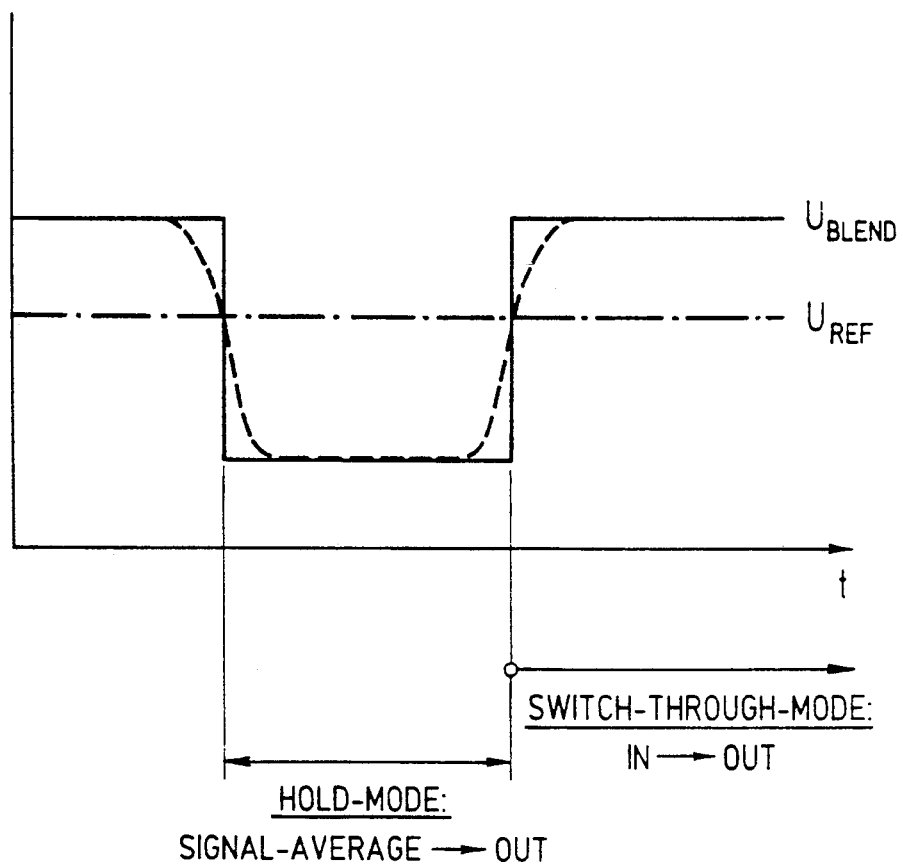
FIG. 1C is a signal diagram illustrating the operation of circuit part SH.

A discrete solution for a suitable sample and hold circuit is illustrated in FIG. 1B. A commercially available "balanced modulator" employing bipolar technology is used. In FIG. 1B, the signal $u_{Blend}$ is the delayed signal from comparator COMP shown at location 7 in FIG. 1. The signal $U_{ref}$ defines a selected reference, or threshold value. When $u_{Blend}$ is higher than $U_{ref}$, circuit SH switches its input signal through to its output OUT; when $u_{Blend}$ is lower than $U_{ref}$, circuit SH is switched to its hold mode so that the signal at output OUT represents the average value of the input signal during a selected period prior to switching. This relationship is shown in FIG. 1C, where the solid line waveform represents the output from a digital comparator and the broken line waveform illustrates the output from an analog comparator.

The mode of operation of this circuit is as follows:
resistors R1 to R4 and R9 to R11 are used in a known manner to set the operating points. Capacitors C1 and C2 take on the function of coupling capacitors. AC current is supplied to the emitter of the transistor Q5 at the input IN via resistor R7. If $u_{Blend}$ is clearly greater than $U_{ref}$, the transistor Q1 is switched through and the AC current supplied to the transistor Q5 almost completely flows via R5. With R5 and R7 being of equal size, there are consequently equal alternating voltages present at the input IN and the output OUT. In a known manner, the resistor R8 and the capacitor C3 form a low-pass filter. For frequencies far below the critical frequency of this low-pass filter R8/C3, $U_T$ is identical with the voltage at point OUT. For frequencies far above the critical frequency of the low-pass filter R8/C3, $U_T$ constitutes the mean value. Appropriate current is supplied to Q6 via R6. With the equal position of $u_{Blend}$ ($u_{Blend} >> U_{Ref}$), the current flows to $U_{B+}$ via Q4 without further effects. For the case of $u_{Blend} >> U_{Ref}$, conditions are reversed: the input current flows via Q5 and Q2 to $U_{B+}$ and the current dependent on $U_T$ flows via R6, Q6, Q3 and R5 to OUT. With R6 and R5 of equal size and a gain of unity in OPI, the voltages $U_{OUT}$ and $U_T$ are identical. No compensating current flows, the systems remains at the momentary value of $U_T$. Possible DC current differences between Q5 and Q6 are evened out with Pl in order to avoid DC offset interference during switching.

It is of course also possible to set any intermediate value of the current distribution with $u_{Blend}$. $U_{IN}$ appears correspondingly reduced at the output. Dependent on the input frequency, the superimposition speed and the critical frequency, a resting state of the output voltage will now occur which, when appropriately selected, corresponds to the momentary value of the low frequencies and the mean value of the high frequencies.

Figure 3:
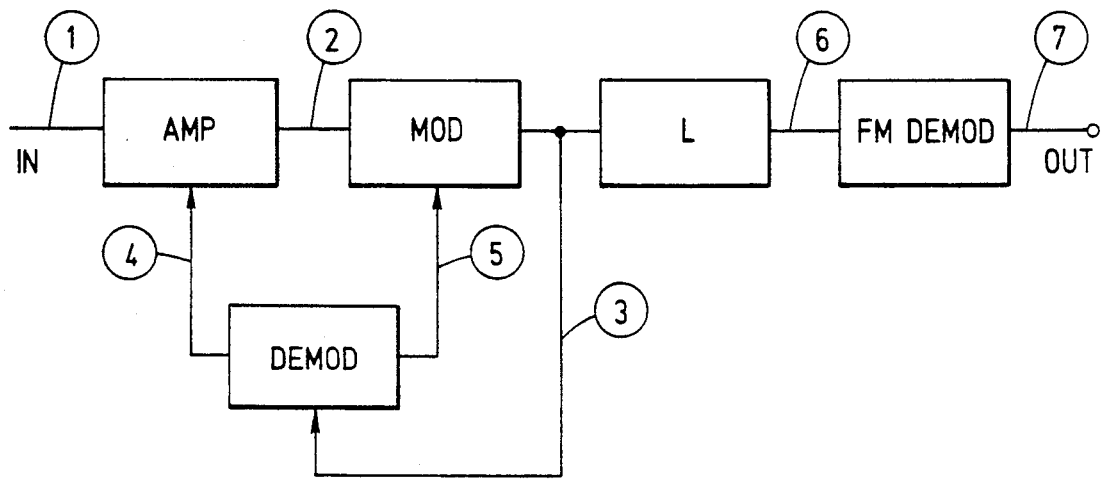
FIG. 3 is a block diagram of the second exemplary embodiment of a circuit for executing the method according to the present invention.
Figure 4:
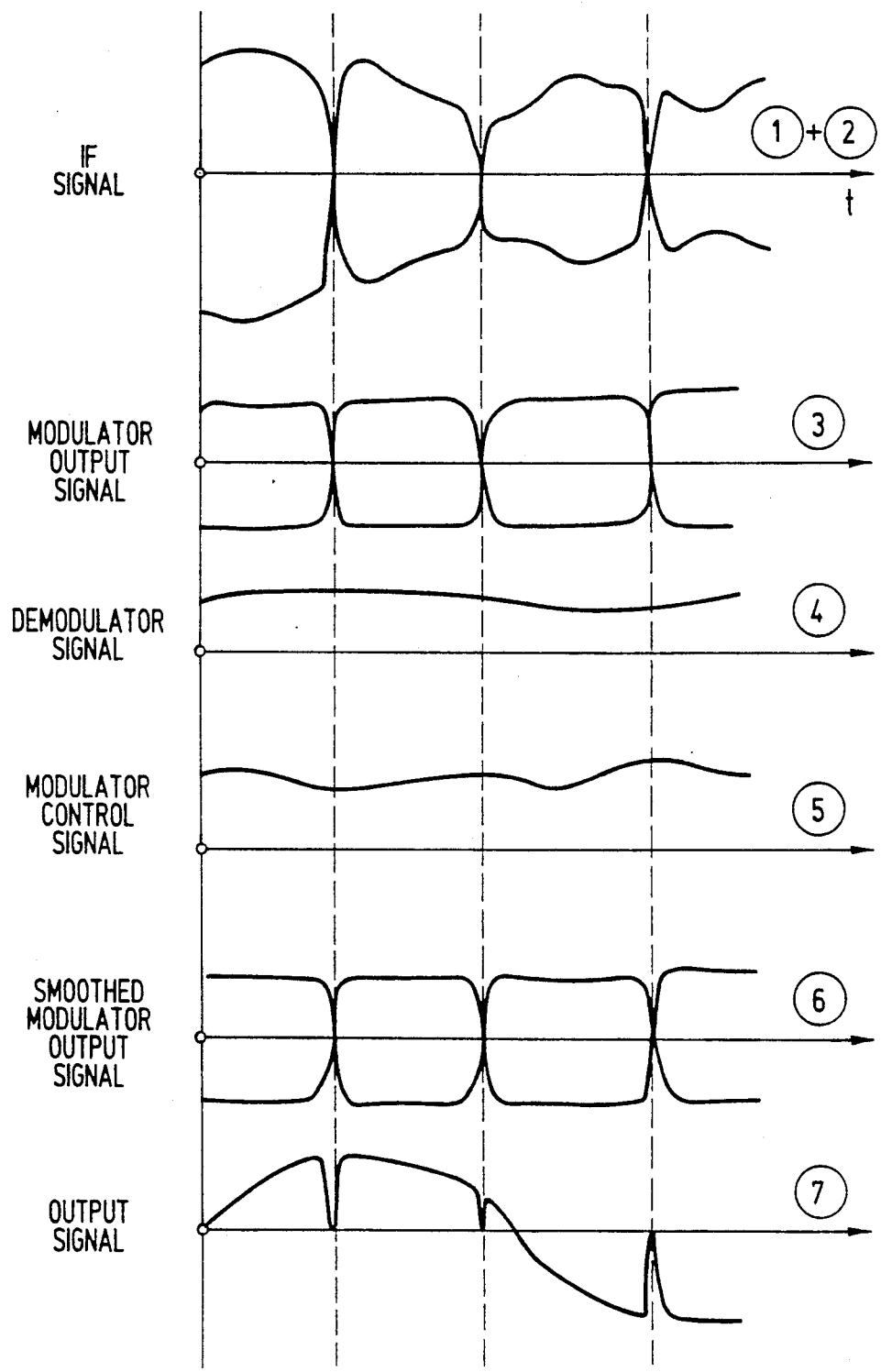
FIG. 4 is a series of diagrams illustrating the signal shapes occurring in sections of the circuit of FIG. 3.

In the second exemplary embodiment illustrated in FIGS. 3 and 4 the IF signal 1 is amplified in an amplifier AMP, and slow field strength fluctuations are compensated. In a downstream modulator MOD the rapid envelope curve fluctuations are accessed and a relatively slightly limited after-limiter L smooths the remaining residual waviness; however, in case of greater amplitude dips it switches to linear operation. Extremely large and rapid dips of the envelope curve, three of which are shown in FIG. 4, are not compensated because of the critical frequency of the modulator MOD, which is kept small, and are therefore automatically blanked at the FM demodulator. Instead of the sharp pulse peaks occurring without blanking, the demodulated output signal 7 therefore has in the correction phase signal reductions as low as down to the zero level, depending on the setting of the after-limiter, which are, depending on the actual amplitude, more or less noticeable, but in any case effect the aural impression considerably less than the otherwise occurring pulse peaks. The slow-controlled amplifier AMP and the rapid modulator MOD with the appropriate time constant $\tau$ take care of the different evaluations of the edge slope, the maximum level control takes care of the correct value of the reference level. The FM demodulator FM-DEMOD downstream may be any conventional FM demodulator, but must not operate in a limiting way during switching operations. In this variant noise is also favorably affected in that amplitude noise is reduced and phase jumps are eliminated.

The demodulator is also dependent on the IF input voltage in quadrature, so that in this alternative, too, soft switching operations during the transition to the correction phase are achieved. since the demodulator progressively follows the IF amplitude.

The circuit element DEMOD in FIG. 3 acts to control the amplification factor of amplifier AMP in such a way that very slow signal amplitude variations are suppressed. For this purpose, DEMOD produces the signal 4 shown in FIG. 4. DEMOD also produces control signal 5 of FIG. 4 in order to control modulator circuit MOD in a manner to suppress very rapid signal fluctuations. Thus, control signals 4 and 5 act on signals 1 and 2, respectively, to produce signal 3 which, except for significant amplitude dips, is substantially free of both slow and rapid field intensity variations.

As a result only those input signal variations which are caused by undesired interference effects are eliminated from the received signal, resulting in the amplitude dips in signal 7, which represent a muting effect during the time of each correction phase.

Figure 3A:
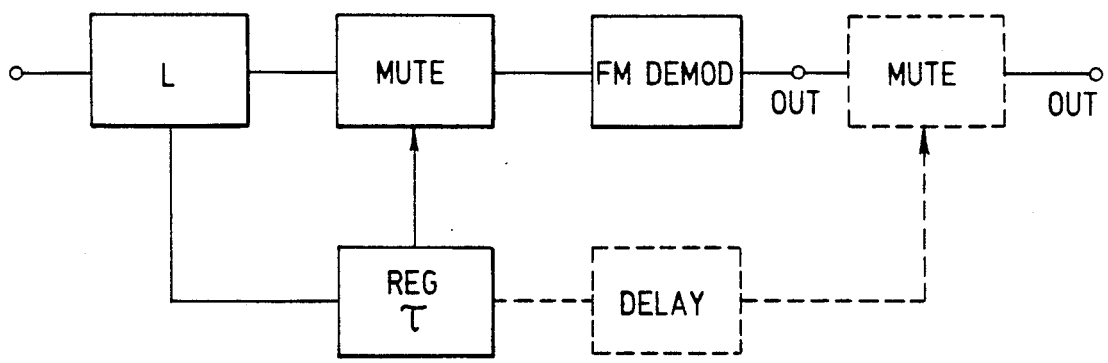
FIG. 3A shows a variant of the second exemplary embodiment of FIG. 3.

A variant of the circuit in accordance with FIG. 3 is illustrated in FIG. 3A. In this case the sequence of limiter and modulator is reversed and the slow controller is omitted. The operation of the circuit is as follows:

Present-day IF-ICs mostly have a logarithmic field strength output. It is known that the depth of the dip is independent of the absolute field strength. A controller REG first adjusts the maxima to the threshold M as previously described. Dips in the field strength are reduced with the time constant $\tau$ in the direction M. The solidly drawn line REG OUT controls the rapid modulator, which customarily is called MUTE in FM receivers. Most FM-ICs have the mute stage downstream of the demodulator (as shown in dashed lines). Because of the unavoidable running time effects, it is then necessary to interpose a running time correction, as represented by the element DELAY.

Figure 5:
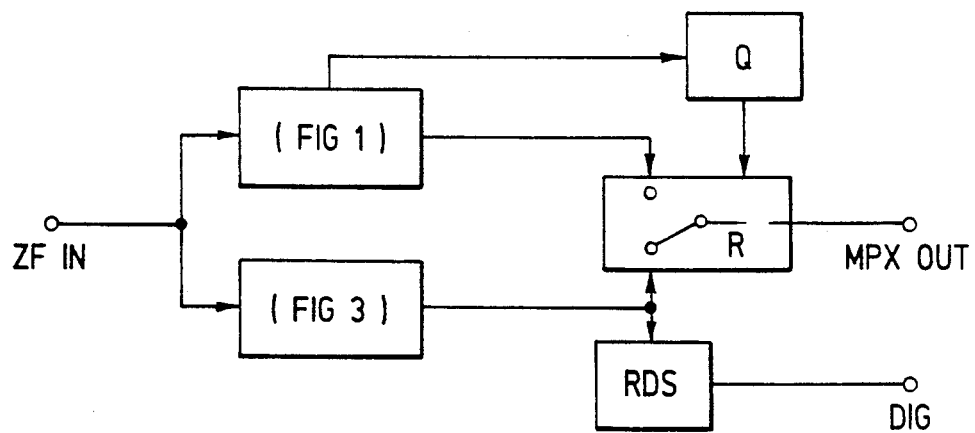
FIG. 5 is a block diagram illustrating combination of the circuit principles depicted in FIGS. 1 and 3.

FIG. 5 shows a block diagram of a combination of the two exemplary embodiments in accordance with FIGS. 1, 2 and 3, 4. A quality evaluation stage Q controls the appropriately most interference-free MPX signal at the output via a switch R.

Figure 6:
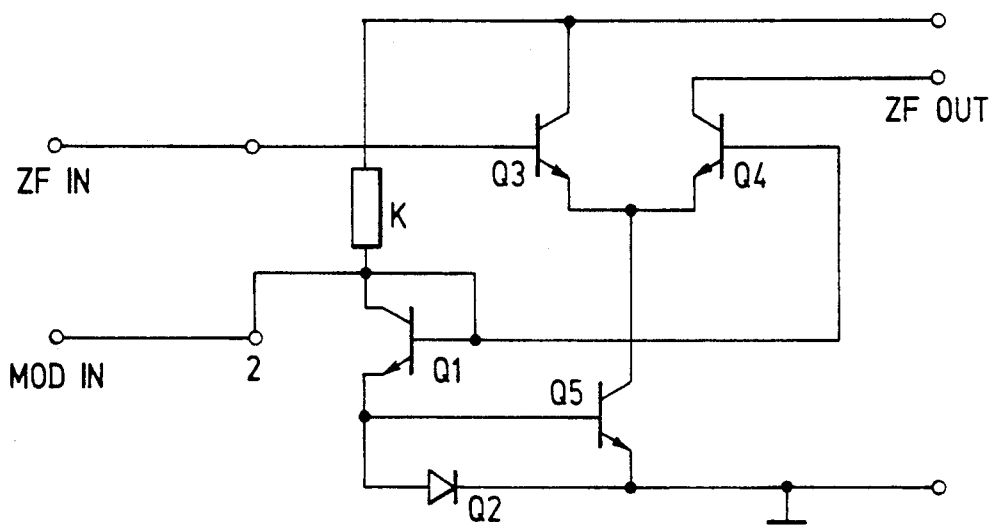
FIG. 6 is a circuit diagram of an exemplary embodiment of an AM modulator for use in the circuit of FIG. 3.

FIG. 6 shows a block diagram of a modulator suitable for integration into an integrated circuit having the arrangement shown in FIG. 3. It comprises a differential amplifier Q3, Q4, the slope, or gain, of which is controlled via the emitter current of Q3 and Q4. This emitter current is modulated from the connection point 2 via a current level circuit Q1,Q5. The operating point setting takes place via the resistor R1. This circuit in principle is a portion of an OTA (operational transconductance amplifier) and can be used in the circuit in accordance with FIG. 3 as limiter L and modulator MOD.

Figure 7:
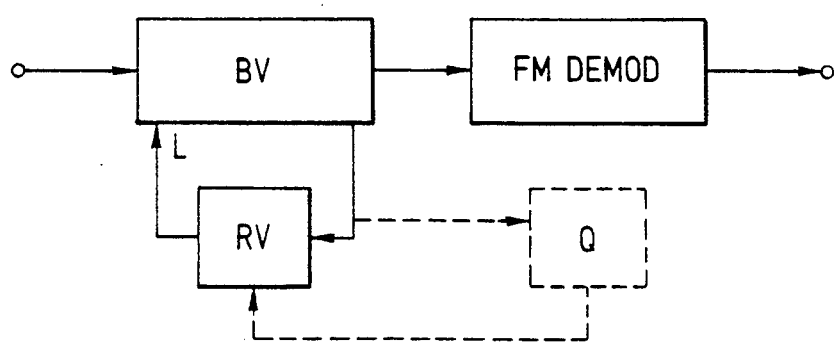
FIG. 7 is a block diagram of an exemplary embodiment of a quasi-linear amplifier for use in the circuit of FIG. 3.

Finally, the circuit diagram of FIG. 7 illustrates a quasi-linear amplifier, in which the gain of a conventional limiter IF amplifier BV is downwardly adjusted via a field strength input L to an appropriate field strength output level. Such an input for amplifier adjustment is also present in some IF-ICs. By means of this it is assured that with each field strength dip exceeding a set amount the limiter leaves the limiting operation and changes over to linear operation. In this case, if it is a system without AM suppression, the subsequent FM demodulator FM-DEMOD will automatically shut off or blank out during the field strength dip because of the quadratic dependence of the demodulated amplitude on the input voltage. Thus, in this realization the interference phase modulation is automatically blanked out in the IF plane. A quality evaluation Q is shown by dashed lines, with the aid of which the occurring phase interferences are evaluated and the described "decoupling" of the IF amplifier is only activated during the presence of extreme phase interference, while the circuit otherwise is operated as a conventional limiter amplifier.

This application relates to subject matter disclosed in German Application number P 40 28 678.8-35, filed on Sep. 11, 1990, the disclosure of which is incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A method for suppressing periodic noise interference in a broadcast signal received by a receiver, in which, during reception of the broadcast signal a dip occurs in the amplitude of the received broadcast signal each time noise interference is present, each dip having a slope, comprising:
    determining the value of the amplitude of the received signal;
    setting a basic received signal threshold value which is less than the value of the received signal at a time when no noise interference is present;
    during each occurrence of noise interference, increasing the threshold value by an amount proportional to the slope of the corresponding dip in the amplitude of the received signal; and
    acting on the received signal to suppress noise interference during a time when the amplitude of the received signal is below the increased threshold value produced by said increasing step.

2. A method in accordance with claim 1 further comprising deriving an intermediate frequency version of the received signal, the intermediate frequency version of the received signal having an envelope curve and demodulating the intermediate frequency version in an FM demodulator, and wherein: said step of determining the amplitude of the received signal is performed by determining the amplitude of the envelope curve; and said step of acting on the received signal comprises interrupting demodulation of the IF signal by superposing a linear amplification which, during a dip of the IF envelope curve, deactivates the FM demodulator.

3. A method in accordance with claim 1 wherein the magnitude of the threshold value is controlled in accordance with the following equation:

$$E_i = M - \Delta M + M_i.$$

wherein $E_i$ is the individual value for elimination of interference associated with a given amplitude dip;
M is the maximum received signal amplitude preceding the amplitude dip;
$\Delta M$ is the difference between M and the basic threshold value at an amplitude dip edge slope $= 0$; and
$M_i$ is the correction value at an edge slope $<0$,
so that with a fixedly set value for $(\Delta M)$, the threshold value $(E_i)$ is decreased with a decreasing value for M, and increased with increasing negative edge slope.

4. A method in accordance with claim 1 wherein the ratio of an amplitude dip to the amplitude of the received signal preceding the amplitude dip is used for a controlling of the switching threshold by using the logarithmic field strength output of an IF receiving component to determine the amplitude of the received signal.

5. A method in accordance with claim 1 wherein during each occurrence of noise interference, said step of acting on the received signal comprises blanking out the received signal and replacing the blanked out signal by the previously present useful signal or a mean value of the same.

6. A circuit arrangement for executing the method in accordance with claim 1, comprising the following components:
- an intermediate frequency circuit connected to receive the received signal and having an intermediate frequency output providing an intermediate frequency version of the received signal and a field strength output providing a signal representing the field strength of the received signal;
- a first sample and hold circuit having an input connected in a circuit path with the intermediate frequency output of the intermediate frequency circuit, a signal output for supplying a useful signal and a control input for receiving a control signal for controlling signal conduction between said input and output;
- a maximum value circuit connected to the field strength output of said intermediate frequency circuit for forming a reference level representing the field strength of the received signal immediately before an amplitude dip;
- a comparator circuit having a first input connected to receive the reference level formed by said maximum value circuit and a second input directly connected with said field strength output of said intermediate frequency circuit, with one of said inputs of said comparator also receiving a potential defining a basic threshold value, said comparator having an output connected to supply a control signal to said control input of said first sample and hold circuit;
- a differentiation circuit having an input connected to said field strength output of said intermediate frequency circuit and an output providing a representation of the time derivative of the signal at said field strength output; and
- a second sample and hold circuit connected between said output of said differentiating circuit and said comparator circuit for increasing the basic threshold value by a correction value corresponding to the slope of the descending edge of an amplitude dip.

7. A circuit arrangement in accordance with claim 6 wherein said first sample and hold circuit has a series circuit comprising a resistor and a capacitor.

8. A circuit arrangement in accordance with claim 6 wherein said first sample and hold circuit has a variable resistor or a mixer with the aid of which a soft insertion or removal of a mean signal value can take place at the beginning or the end of a correction phase.

9. A circuit arrangement for executing the method in accordance with claim 1 comprising a high frequency response control amplifier connected ahead of an FM demodulator in a received signal path to compensate for low frequency fluctuations of an IF envelope curve of the received signal, a low frequency response control amplifier connected in the received signal path to compensate for low frequency fluctuations in the field strength of the received signal.

10. A circuit arrangement in accordance with claim 9 further comprising a limiter connected in the received signal path downstream of at least one of said control amplifiers to produce a slight limitation which smooths the remaining envelope curve fluctuations but does not hinder blanking in case of deep dips of the envelope curve.

* * * * *